(12) United States Patent
Kim et al.

(10) Patent No.: US 12,713,579 B2
(45) Date of Patent: Aug. 18, 2026

(54) MEMORY CELL AND MEMORY DEVICE

(71) Applicant: SK hynix Inc., Gyeonggi-do (KR)

(72) Inventors: Seung Hwan Kim, Gyeonggi-do (KR); Dong Sun Sheen, Gyeonggi-do (KR); Su Ock Chung, Gyeonggi-do (KR); Il Sup Jin, Gyeonggi-do (KR); Seon Yong Cha, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 489 days.

(21) Appl. No.: 18/492,789

(22) Filed: Oct. 24, 2023

(65) Prior Publication Data

US 2024/0057309 A1 Feb. 15, 2024

Related U.S. Application Data

(62) Division of application No. 17/356,816, filed on Jun. 24, 2021, now Pat. No. 11,832,434.

(30) Foreign Application Priority Data

Dec. 29, 2020 (KR) ........................ 10-2020-0185964

(51) Int. Cl.
*H10B 12/00* (2023.01)

(52) U.S. Cl.
CPC .................................... *H10B 12/30* (2023.02)

(58) Field of Classification Search
CPC .... H10B 12/30; H10B 12/482; H10B 12/488; H10D 30/6757; H10D 88/00; H10D 88/101
See application file for complete search history.

(56) References Cited

U.S. PATENT DOCUMENTS

2011/0111568 A1* 5/2011 Kim ........................ H10D 30/63
257/E21.421
2019/0164985 A1 5/2019 Lee et al.
2021/0125989 A1* 4/2021 Shin ........................ H10B 12/20

FOREIGN PATENT DOCUMENTS

CN 1959960 A 5/2007
CN 102544016 A 7/2012
CN 111627885 A 9/2020
CN 113903741 A 1/2022
KR 10-2019-0060251 A 6/2019
(Continued)

OTHER PUBLICATIONS

Office Action for Chinese Patent Application No. 202111622947.2 issued by the Chinese Patent Office on Nov. 8, 2024.
(Continued)

*Primary Examiner* — Joshua Benitez Rosario
*Assistant Examiner* — John Lin
(74) *Attorney, Agent, or Firm* — IP&T GROUP LLP

(57) ABSTRACT

A memory cell includes: a substrate; an active layer spaced apart from a surface of the substrate and extending in a direction which is parallel to the surface of the substrate; a bit line coupled to one side of the active layer and extending in a direction perpendicular to the surface of the substrate; a capacitor coupled to another side of the active layer and spaced apart from the surface of the substrate; and a word line vertically spaced apart from the active layer and extending in a direction intersecting with the active layer, wherein the word line includes a first notch-shaped sidewall and a second notch-shaped sidewall that face each other.

12 Claims, 9 Drawing Sheets

(56) References Cited

FOREIGN PATENT DOCUMENTS

| | | |
|---|---|---|
| KR | 10-2020-0061871 A | 6/2020 |
| KR | 10-2020-0105216 A | 9/2020 |

OTHER PUBLICATIONS

Office Action for the Korean Patent Application No. 10-2020-0185964 issued by the Korean Intellectual Property Office on Jan. 8, 2025.

* cited by examiner

MEMORY CELL AND MEMORY DEVICE

CROSS-REFERENCE TO RELATED APPLICATIONS

This application is a division of U.S. patent application Ser. No. 17/356,816 filed on Jun. 24, 2021, which claims priority of Korean Patent Application No. 10-2020-0185964, filed on Dec. 29, 2020, which is incorporated herein by reference in its entirety.

BACKGROUND

1. Field

Exemplary embodiments of the present invention relate to a semiconductor device, and more particularly, to memory cells and a memory device with improved degree of integration.

2. Description of the Related Art

Since the degree of integration of a two-dimensional (2D) memory device is mainly determined based on the area occupied by a unit memory cell, it is affected by a fine patterning technique. Highly expensive equipment is generally required for the fine patterning, but there are still limitation in increasing the degree of integration of a 2D memory device. To improve the degree of integration, three-dimensional memory devices including memory cells that are arranged in three dimensions are proposed.

SUMMARY

Embodiments of the present invention are directed to memory cells and a memory device with improved degree of integration.

In accordance with an embodiment of the present invention, a memory cell includes: a substrate; an active layer spaced apart from a surface of the substrate and extending in a direction which is parallel to the surface of the substrate; a bit line coupled to one side of the active layer and extending in a direction perpendicular to the surface of the substrate; a capacitor coupled to another side of the active layer and spaced apart from the surface of the substrate; and a word line vertically spaced apart from the active layer and extending in a direction intersecting with the active layer, wherein the word line includes a first notch-shaped sidewall and a second notch-shaped sidewall that face each other.

In accordance with another embodiment of the present invention, a memory cell includes: a substrate; a bit line extending in a direction perpendicular to the surface of the substrate; a capacitor laterally spaced apart from the bit line; and a transistor positioned between the bit line and the capacitor, wherein the transistor includes: an active layer laterally extending between the bit line and the capacitor; and a notch-shaped word line and a notch-shaped shield word line facing each other with the active layer therebetween.

In accordance with another embodiment of the present invention, a memory cell includes: a substrate; a bit line extending in a direction perpendicular to the surface of the substrate; a capacitor laterally spaced apart from the bit line; an active layer laterally extending between the bit line and the capacitor; a notch-shaped word line and a notch-shaped shield word line facing each other with the active layer therebetween; and a vertical cell isolation layer supporting the notch-shaped word line and the notch-shaped shield word line and extending in a direction perpendicular to the surface of the substrate.

In accordance with another embodiment of the present invention, a memory device includes: a substrate; a memory cell array including a plurality of memory cells that are stacked in a direction perpendicular to a surface of the substrate; and a cell isolation layer extending in a direction that the memory cells are stacked and supporting the memory cells, wherein each of the memory cells includes: a bit line extending in a direction perpendicular to a surface of the substrate; a capacitor laterally spaced apart from the bit line; an active layer laterally extending between the bit line and the capacitor; and a notch-shaped word line and a notch-shaped shield word line facing each other with the active layer therebetween.

In accordance with another embodiment of the present invention, a memory cell includes: a substrate; an active layer spaced apart from a surface of the substrate and including a channel extending in a direction which is parallel to the surface of the substrate; a bit line coupled to one side of the active layer and extending in a direction perpendicular to the surface of the substrate; a capacitor coupled to another side of the active layer and spaced apart from the surface of the substrate; and a word line vertically spaced apart from the active layer and extending in a direction crossing the active layer, wherein the channel of the active layer includes round sidewalls having protrusions vertically overlapping with the word line.

DETAILED DESCRIPTION

Figure 1:
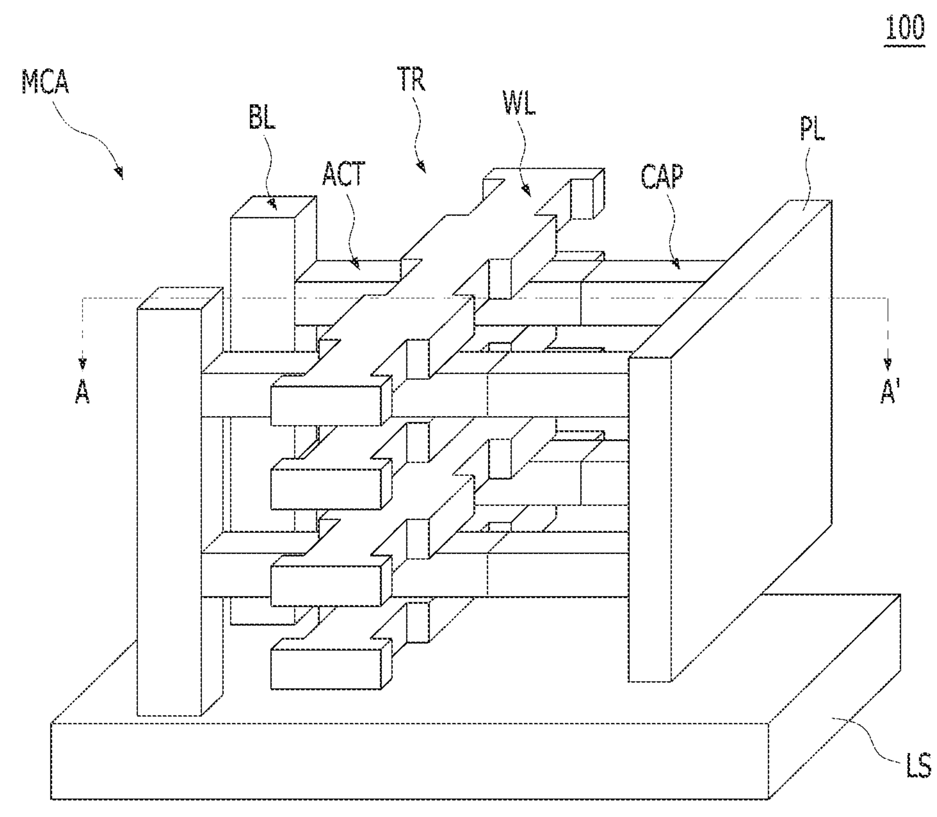
FIG. 1 is a perspective view illustrating a schematic structure of a memory device in accordance with an embodiment of the present invention.
Figure 1:
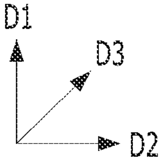

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, the various embodiments of the present invention will be described in detail with reference to the attached drawings.

The drawings are not necessarily to scale, and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

A memory device in accordance with the embodiments of the present invention may include a plurality of memory cells, and each of the memory cells may include a lateral active layer, a lateral word line, a vertical bit line, and a lateral capacitor.

Figure 2A:
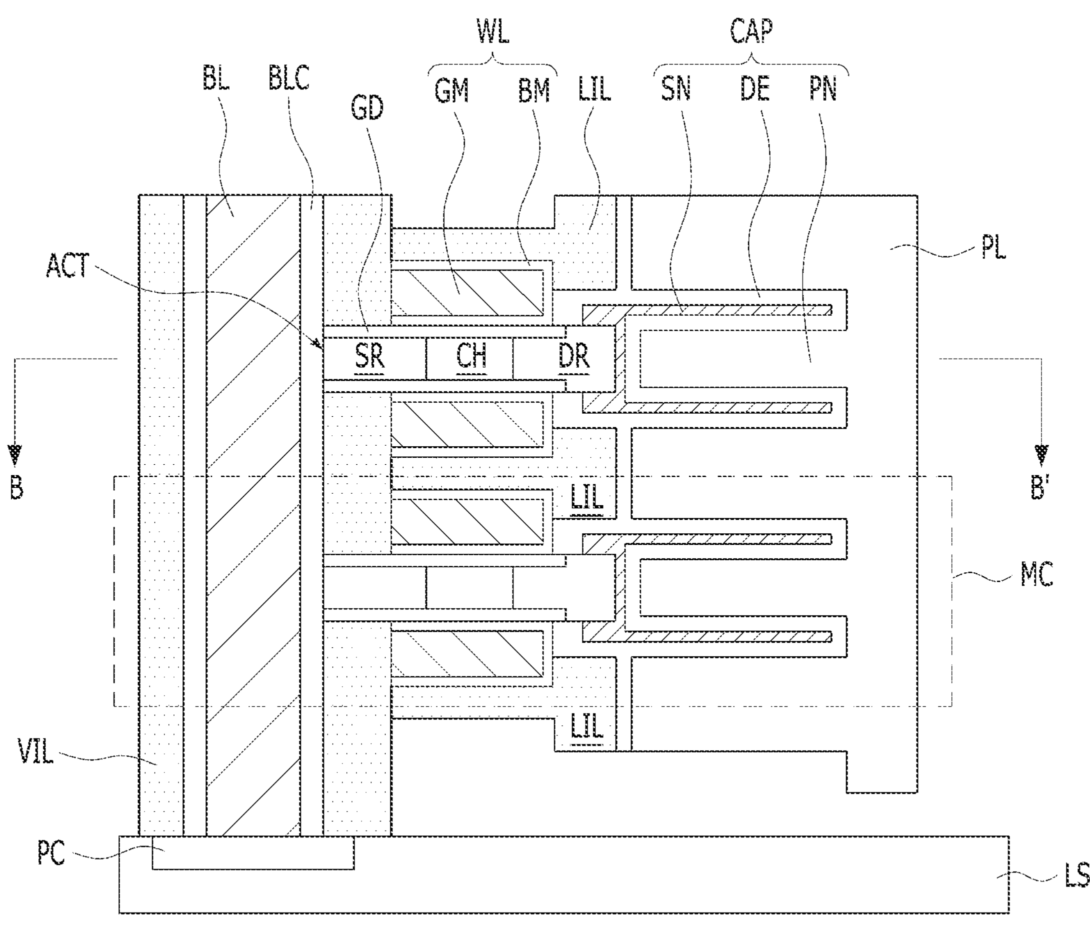
FIG. 2A is a cross-sectional view taken along a line A-A' shown in FIG. 1.
Figure 2A:
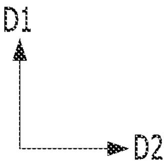
Figure 2B:
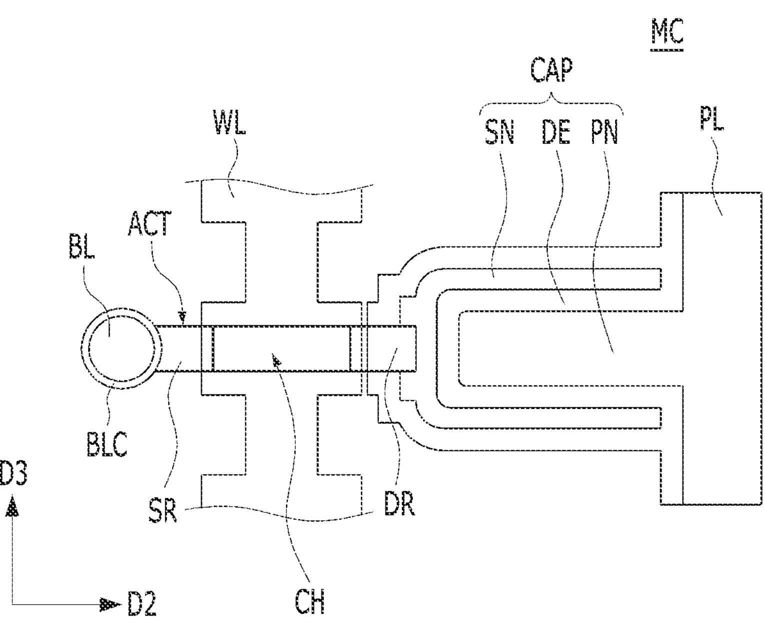
FIG. 2B is a layout of an individual memory cell taken along a line B-B' shown in FIG. 2A.
Figure 2C:
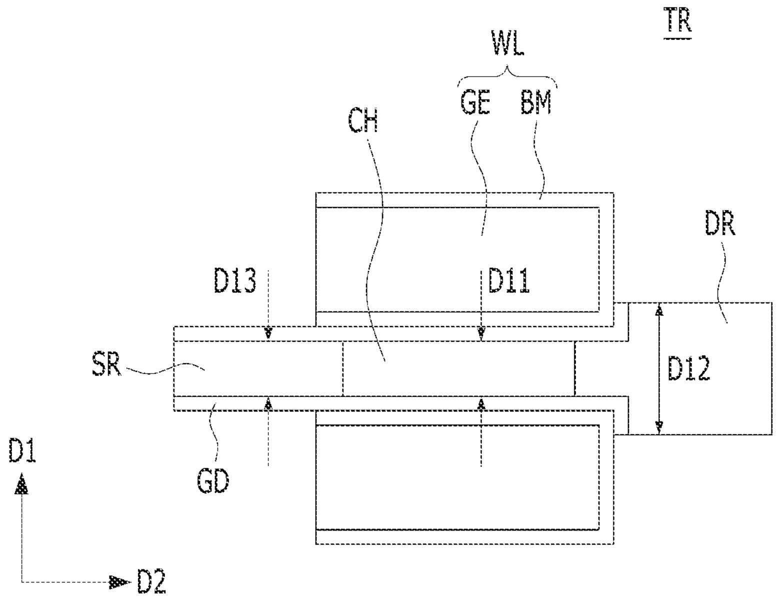
FIG. 2C is a detailed view of a transistor shown in FIG. 2A.

FIG. 1 is a perspective view illustrating a schematic structure of a memory device in accordance with an embodiment of the present invention. FIG. 2A is a cross-sectional view taken along a line A-A' shown in FIG. 1. FIG. 2B is a layout of an individual memory cell taken along a line B-B' shown in FIG. 2A. FIG. 2C is a detailed view of a transistor shown in FIG. 2A.

Referring to FIGS. 1, 2A, 2B, and 2C, the memory device 100 may include a plurality of memory cells MC, and the memory cells MC may be positioned over the substrate LS. The memory cells MC may be stacked vertically from the substrate LS in a first direction D1. The memory cells MC may include memory cells of a Dynamic Random-Access Memory (DRAM). Each of the memory cells MC may have a three-dimensional structure.

Each memory cell MC may include a bit line BL, a transistor TR, a capacitor CAP, and a plate line PL. The bit line BL may be vertically oriented in the first direction D1 over the substrate LS. The memory cells MC stacked in the first direction D1 may share the bit line BL. The transistor TR and the capacitor CAP may be positioned in a lateral arrangement in a second direction D2 from the bit line BL. The second direction D2 may intersect with the first direction D1, and a third direction D3 may intersect with the first direction D1 and the second direction D2. The memory cells MC may include memory cells of the three-dimensional (3D) DRAM having a 1T-1C (1 transitor-1 capacitor) structure. The transistor TR may include a word line WL. The word line WL may extend in the third direction D3. The third direction may be parallel to the upper surface of the substrate LS. The plate line PL may extend in the third direction D3 while being vertically oriented in the first direction D1. The plate line PL may be coupled to the capacitor CAP.

The substrate LS may be a material appropriate for semiconductor processing including, for example, at least one among a conductive material, a dielectric material, and a semiconductor material. Diverse materials may be formed over the substrate LS. The substrate LS may include a semiconductor substrate. The substrate LS may be formed of a material containing silicon. The substrate LS may include silicon, monocrystalline silicon, polysilicon, amorphous silicon, silicon germanium, monocrystalline silicon germanium, polycrystalline silicon germanium, carbon-doped silicon, combinations thereof, or multi-layers thereof. The substrate LS may also include other semiconductor materials, such as germanium. The substrate LS may include a III/V-group semiconductor substrate, for example, a compound semiconductor substrate, such as GaAs. The substrate LS may include a Silicon-On-Insulator (SOI) substrate.

The substrate LS may include a peripheral circuit portion PC. The peripheral circuit portion PC may include a plurality of control circuits for controlling the memory cells MC. The peripheral circuit portion PC may be positioned at a lower level than the memory cells MC. At least one control circuit of the peripheral circuit unit PC may include an N-channel transistor, a P-channel transistor, a CMOS circuit, or a combination thereof. At least one control circuit of the peripheral circuit unit PC may include an address decoder circuit, a read circuit, and a write circuit. At least one control circuit of the peripheral circuit portion PC may include a planar channel transistor, a recess channel transistor, a buried gate transistor, and a Fin channel transistor (FinFET) and the like.

For example, the peripheral circuit portion PC may include a sense amplifier. The sense amplifier may be coupled to the bit line BL of the memory cells MC. The peripheral circuit portion PC may further include a word line driver, and the word line driver may be coupled to the word line WL of the memory cells MC.

Although not illustrated, the plate line PL may be coupled to another peripheral circuit portion or may be coupled to the substrate LS.

The peripheral circuit portion PC may be positioned at a higher level than the memory cell array MCA. Accordingly, the memory device 100 may have a PUC (Peri-under-Cell) structure.

According to another embodiment of the present invention, the memory cell array MCA may be positioned below the peripheral circuit portion PC. Accordingly, the memory device 100 may have a CUP (Cell-under-Peri) structure.

The bottom portion of the bit line BL may be coupled to the substrate LS. The bit line BL may have a pillar-shape. The bit line BL may be referred to as a vertically oriented bit line or a pillar-type bit line. The bit line BL may include a low-resistance conductive material. The bit line BL may include polysilicon, a metal, a metal nitride, a metal silicide, or a combination thereof. The bit line BL may include a silicon-based material, a metal-based material, or a combination thereof. The bit line BL may include polysilicon, titanium nitride, tungsten, or a combination thereof. For example, the bit line BL may include polysilicon or titanium nitride (TiN) that is doped with an N-type impurity. The bit line BL may include a stack of titanium nitride and tungsten (TiN/W). The bit line BL may further include an ohmic contact layer, such as a metal silicide. The bit line BL may include pillar-type tungsten and titanium nitride surrounding the outer wall of the pillar-type tungsten.

A bit line contact node BLC may be formed between the bit line BL and the first source/drain region SR. The bit line contact node BLC may surround the bit line BL. The bit line contact node BLC may extend in the first direction D1 perpendicular to the substrate LS. The bit line contact node BLC may include polysilicon, a metal, a metal nitride, a metal silicide, or a combination thereof. The bit line contact node BLC may include a silicon-based material, a metal-based material, or a combination thereof. The bit line contact node BLC may include polysilicon, titanium nitride, tungsten, or a combination thereof. For example, the bit line contact node BLC may include polysilicon doped with an N-type impurity (which is called, hereinafter, N-type doped polysilicon). According to another embodiment of the present invention, the bit line contact node BLC may include a stack of N-type doped polysilicon and titanium nitride (TiN).

The transistor TR may include an active layer ACT and a word line WL. The active layer ACT may be laterally oriented in the second direction D2 between the bit line BL and the capacitor CAP. The active layer ACT may extend from the bit line BL to the capacitor CAP. The active layer ACT may include a channel layer CH, a first source/drain region SR, and a second source/drain region DR. The first source/drain region SR may be coupled to the bit line BL, and the second source/drain region DR may be coupled to the capacitor CAP. The channel CH may be laterally positioned between the first source/drain region SR and the second source/drain region DR. The word line WL may extend in the third direction D3 and overlap with the channel. Both edge portions of the word line WL may partially overlap with the first source/drain regions SR and the second source/drain region DR, respectively. The transistor TR may include a lateral transistor.

The active layer ACT may include a semiconductor material. The active layer ACT may include a silicon-containing layer or a silicon germanium-containing layer. For example, the active layer ACT may include doped polysilicon, undoped polysilicon, amorphous silicon, silicon germanium, or a combination thereof. The active layer ACT may include nano-wire or nano-sheet, and the nano-wire and the nano-sheet may be formed of a semiconductor material.

According to another embodiment of the present invention, the active layer ACT may include an oxide semiconductor material. According to another embodiment of the present invention, the active layer ACT may include a compound of a transition metal and chalcogen. The active layer ACT may include $InGaZnO_x$ (IGZO) $InSnZnO_x$, $ZnSnO_x$, $MoS_2$, $WS_2$, or $MoSe_2$. The first source/drain region SR and the second source/drain region DR may be positioned at both ends of the active layer ACT, respectively. For example, the first source/drain region SR and the second source/drain region DR may be formed at both ends of the active layer ACT by ion implantation or plasma doping of impurities.

The word line WL may include notch-shaped sidewalls facing each other in the second direction D2. For example, the word line WL shown in FIG. 1 includes a plurality of rectangular shape notches spaced apart along the third direction D3 in each one of its sidewalls. The word line WL may have a linear shape crossing the upper and lower surfaces of the active layer ACT. The word line WL may include a low-resistance conductive material. The word line WL may include a low-resistance metal material. The word line WL may include polysilicon, a metal, a metal nitride, a metal silicide, or a combination thereof. The word line WL may include a silicon-based material, a metal-based material, or a combination thereof. The word line WL may include tungsten (W), titanium nitride (TiN), tantalum nitride (TaN), tantalum carbon nitride (TaCN), molybdenum (Mo), molybdenum nitride (MoN), ruthenium (Ru), cobalt (Co), or a combination thereof. The word line WL may include polysilicon, titanium nitride, tungsten, or a combination thereof. For example, the word line WL may include a stack of titanium nitride and tungsten (TiN/W). The word line WL may include an N-type work function material or a P-type work function material. The N-type work function material may have a low work function of approximately 4.5 or less, and the P-type work function material may have a high work function of approximately 4.5 or more. The word line WL may include a stack of a barrier material BM and a gate electrode GM. The barrier material BM may include titanium nitride, and the gate electrode GM may include tungsten. The barrier material BM may partially surround the gate electrode GM. For example, one side of the gate electrode GM adjacent to the bit line BL may not be covered by the barrier material BM. The other side of the gate electrode GM adjacent to the capacitor CAP may be covered by the barrier material BM. The upper and lower surfaces of the gate electrode GM may be covered by the barrier material BM.

According to the embodiment of the present invention, each memory cell MC may include a pair of word lines WL facing each other with the active layer ACT interposed therebetween. For example, of the pair of word lines WL, the word line WL positioned over the active layer ACT may be referred to as an upper-level word line, and the word line WL positioned below the active layer ACT may be referred to as a lower-level word line WL. The pair of word lines WL may be formed of the same material. The pair of word lines WL may have different potentials. For example, in each memory cell MC, a word line driving voltage may be applied to the upper-level word line WL, and a ground voltage may be applied to the lower-level word line WL. The lower-level word line WL may serve to block interference of the upper-level word lines WL between the memory cells MC that are vertically positioned in the first direction D1. The lower-level word line WL may be referred to as a back word line or a shield word line. According to another embodiment of the present invention, the word line driving voltage may be applied to the lower-level word line WL, and the ground voltage may be applied to the upper-level word line WL. The upper-level word line WL may serve to block interference of the lower-level word lines WL between the memory cells MC that are positioned vertically in the first direction D1. Each of the lower-level word line WL and the upper-level word line WL may include a stack of a barrier material BM and a gate electrode GM. As described above, the word line WL may have a dual word line structure. According to another embodiment of the present invention, a pair of word lines WL may have the same potential.

A gate dielectric layer GD may be positioned between the word line WL and the active layer ACT. The gate dielectric layer GD may include silicon oxide, silicon nitride, a high-dielectric constant material, a ferroelectric material, an anti-ferroelectric material, or a combination thereof. The gate dielectric layer GD may include $SiO_2$, $Si_3N_4$, $HfO_2$, $Al_2O_3$, $ZrO_2$, AlON, HfON, HfSiO, HfSiON, and the like.

Referring back to FIG. 2C, the transistor TR may include an active layer ACT extending in the second direction D2 and word lines WL facing each other with the active layer ACT interposed therebetween. The word lines WL may include a stack of a barrier material BM and a gate electrode GM. The active layer ACT may include a first source/drain region SR, a second source/drain region DR, and a channel CH between the first source/drain region SR and the second source/drain region DR. The word lines WL and the channel CH may vertically overlap with each other in the first direction D1. The thickness D11 of the channel CH in the first direction D1 may be thinner than the thickness D12 of the second source/drain region DR. The thickness D11 of the channel CH in the first direction D1 may be the same as the thickness D13 of the first source/drain region SR. The channel CH may be referred to as a thin channel or a thin body. The lower surface of the upper-level word line WL may be positioned at a lower level than the upper surface of the second source/drain region DR. The upper surface of the lower-level word line WL may be positioned at a higher level than the lower surface of the second source/drain region DR.

The distance between the word lines WL becomes close due to the thin channel CH, and accordingly, the spacing between the memory cells MC that are stacked in the first direction D1 may decrease. When the spacing between the memory cells MC decreases, the degree of integration of the memory cells MC may be increased.

According to another embodiment of the present invention, the thickness D11 of the channel CH in the first direction D1 may be smaller than the thickness D12 of the second source/drain region DR and the thickness D13 of the first source/drain region SR. In other words, the first source/drain region SR may be thicker than the channel CH, which is the same as the second source/drain region DR.

The capacitor CAP may include a storage node SN, a dielectric layer DE, and a plate node PN. The storage node SN of the capacitor CAP may be coupled to the second source/drain area DR. The plate node PN of the capacitor CAP may be coupled to the plate line PL. The plate node PN and the plate line PL may have an integrated structure.

The capacitor CAP may include a Metal-Insulator-Metal (MIM) capacitor. The storage node SN and the plate node PN may include a metal-based material. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer DE may be formed of a composite layer including two or more layers of the high-k materials mentioned above.

The dielectric layer DE may be formed of a zirconium (Zr)-based oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as zirconium oxide ($ZrO_2$)-based layers. According to another embodiment of the present invention, the dielectric layer DE may be formed of a hafnium (Hf)-based oxide. The dielectric layer DE may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material having a greater band gap than that of the high-k material. The dielectric layer DE may include silicon oxide ($SiO_2$) as a high band gap material other than aluminum oxide ($Al_2O_3$). Since the dielectric layer DE contains a high band gap material, leakage current may be suppressed. The high band gap material may be extremely thin. The high band gap material may be thinner than the high-k material. According to another embodiment of the present invention, the dielectric layer DE may include a laminated structure in which a high-k material and a high band gap material are alternately stacked. For example, the dielectric layer DE may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminate structure as above, aluminum oxide ($Al_2O_3$) may be extremely thin.

According to another embodiment of the present invention, the dielectric layer DE may include a stack structure, a laminated structure, or a mixed structure including zirconium oxide, hafnium oxide, and aluminum oxide.

According to another embodiment of the present invention, an interface control layer for improving leakage current may be further formed between the storage node SN and the dielectric layer DE. The interface control layer may include titanium oxide ($TiO_2$). The interface control layer may also be formed between the plate node PN and the dielectric layer DE.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a stack of titanium nitride/tungsten (TiN/W), a stack of tungsten nitride/tungsten (WN/W). The plate node (PN) may include a combination of a metal-based material and a silicon-based material. For example, the plate node PN may be a stack of titanium nitride/silicon germanium/tungsten nitride (TiN/SiGe/WN). In the stack of titanium nitride/silicon germanium/tungsten nitride (TiN/SiGe/WN), silicon germanium may be a gap-fill material filling the cylindrical inside of the storage node SN, and titanium nitride (TiN) may substantially serve as a plate node of a capacitor CAP. Tungsten nitride may be a low resistance material.

The storage node SN may have a three-dimensional structure, and the storage node SN having the three-dimensional structure may have a lateral three-dimensional structure which is parallel to the second direction D2. As an example of the three-dimensional structure, the storage node SN may have a cylinder shape, a pillar shape, or a pylinder shape. Here, the pylinder shape may refer to a structure in which a pillar shape and a cylinder shape are merged.

A portion of the storage node SN and a portion of the dielectric layer DE may partially cover an edge of one side of the second source/drain region DR.

Cell isolation layers LIL and VIL may be formed between the memory cells MC. The cell isolation layers LIL and VIL may include a dielectric material. The cell isolation layers LIL and VIL may include silicon oxide ($SiO_2$), silicon nitride ($Si_3N_4$), silicon oxynitride (SiON), silicon carbon oxide (SiCO), silicon carbon nitride (SiCN), or a combination thereof. The cell isolation layers LIL and VIL may include a lateral cell isolation layer LIL and a vertical cell isolation layer VIL. The lateral cell isolation layer LIL may extend laterally in the second direction D2, and in this case, it may be positioned between the memory cells MC that are stacked in the first direction D1. The vertical cell isolation layer VIL may extend vertically in the first direction D1, and in this case, it may be positioned between the memory cells MC that are adjacent to each other in the third direction D3. The cell isolation layers LIL and VIL may protect the word lines WL from collapsing and bending. The cell isolation layers LIL and VIL may serve as a supporter that supports sidewalls of the word lines WL. The bit line BL may penetrate the vertical cell isolation layer VIL. A portion of the vertical cell isolation layer VIL may contact one side of a word line WL.

Figure 3:
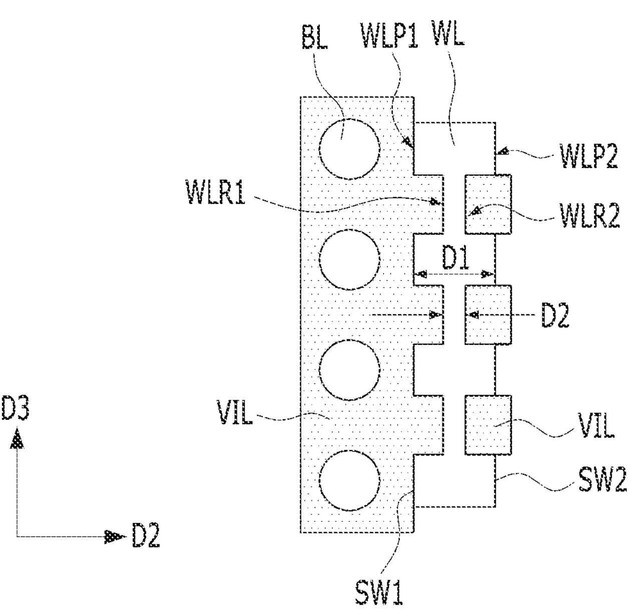
FIG. 3 is a detailed layout of a word line shown in FIG. 2A.

FIG. 3 is a detailed layout of the word line shown in FIG. 2A. Referring to FIG. 3, the word line WL may include a first sidewall SW1 extending in the third direction D3 and a second sidewall SW2 facing the first sidewall SW2. The first sidewall SW1 may include first flat surfaces WLP1 and first recess surfaces WLR1. The first flat surfaces WLP1 and the first recess surfaces WLR1 may be alternately repeated in the third direction D3. The first flat surfaces WLP1 may be flat sidewalls, and the first recess surfaces WLR1 may be recessed sidewalls. The first recess surfaces WLR1 may have, for example, a rectangular shape profile, but other profiles may be used. Each of the first flat surfaces WLP1 may be adjacent to the bit lines BL. The first flat surfaces WLP1 and the bit lines BL may be laterally adjacent to each other in the second direction D2. The first recess surfaces WLR1 may be spaced apart from the bit lines BL. The distance between the first flat surfaces WLP1 and the bit lines BL may be shorter than the distance between the first recess surfaces WLR1 and the bit lines BL.

Like the first sidewall SW1, the second sidewall SW2 may include second flat surfaces WLP2 and second recess surfaces WLR2. The second flat surfaces WLP2 and the second recess surfaces WLR2 may be alternately repeated in the third direction D3.

The first flat surfaces WLP1 and the second flat surfaces WLP2 may face each other. The first recess surfaces WLR1 and the second recess surfaces WLR2 may face each other. The distance D1 between the first flat surfaces WLP1 and the second flat surfaces WLP2 may be longer than the distance D2 between the first recess surfaces WLR1 and the second recess surfaces WLR2. The first recess surfaces WLR1 and the second recess surfaces WLR2 may have a flat shape. For example, each of the first recess surfaces WLR1 and the second recess surfaces WLR2 may have a rectangular notch shape and they may be symmetrical to each other.

As described above, the word line WL may be a notch-shaped word line, and the notches provided to the first sidewalls SW1 and the second sidewalls SW2, that is, the first recess surfaces WLR1 and the second recess surfaces WLR2, may be symmetrical to each other. A pair of word lines WL may be the same notch-shaped word lines. The first and second recess surfaces WLR1 and WLR2 may be supported by the cell isolation layers LIL and VIL.

By forming notch-shaped word lines, the bridge effect occurring between the neighboring memory cells may be prevented. Also, by forming the notch-shaped word lines, the capacitance between the word lines may be reduced.

Figure 4A:
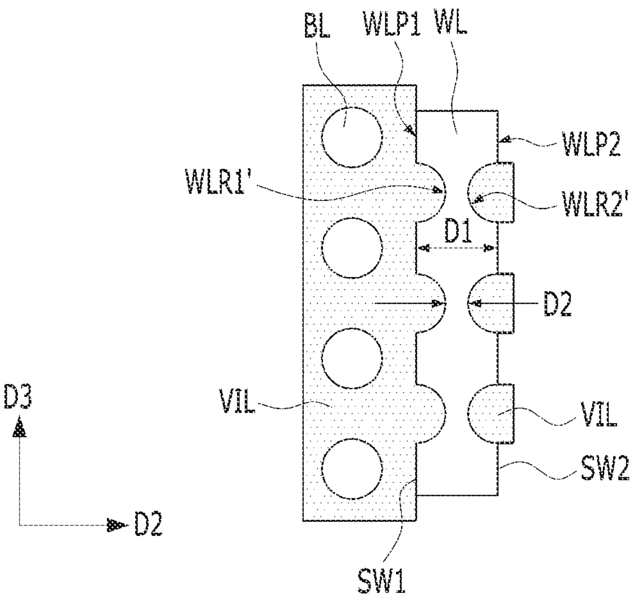
FIGS. 4A and 4B are layouts illustrating a word line in accordance with another embodiment of the present invention.
Figure 4B:
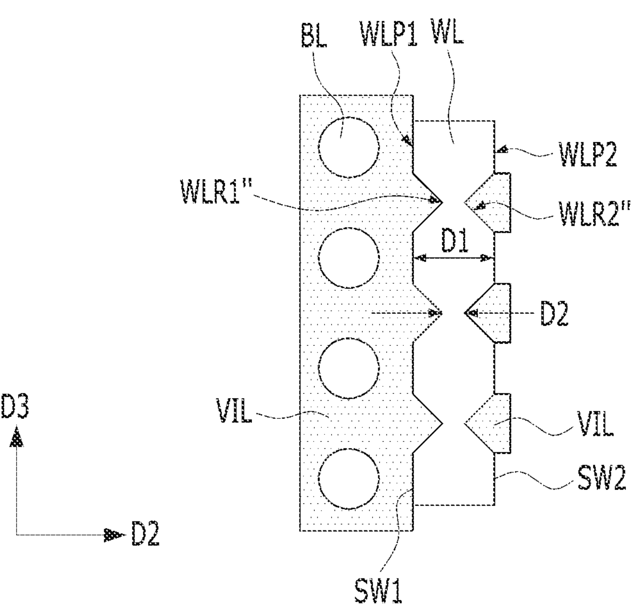

FIGS. 4A and 4B are layouts illustrating a word line in accordance with another embodiment of the present invention. In FIGS. 4A and 4B, the first and second flat surfaces WLP1 and WLP2 may be the same as the first and second flat surfaces WLP1 and WPL2 shown in FIG. 3.

Referring to FIG. 4A, the word line WL may include a first sidewall SW1 which extends in the third direction D3 and a second sidewall SW2 which faces the first sidewall SW2. The first sidewall SW1 may include first flat surfaces WLP1 and first recess surfaces WLR1'. The first flat surfaces WLP1 and the first recess surfaces WLR1' may be alternately repeated in the third direction D3. The first flat surfaces WLP1 may be flat sidewalls, and the first recess surfaces WLR1' may be recessed sidewalls. Each of the first flat surfaces WLP1 may be positioned adjacent to the bit lines BL. Each of the first flat surfaces WLP1 may be aligned in the second direction D2 with a corresponding bit line but may not be in contact with a corresponding bit line BL. The cell isolation layer VIL may be interposed between a first flat surface WLP1 and a corresponding bit line. The first flat surfaces WLP1 and the bit lines BL may be laterally adjacent to each other in the second direction D2. The first recess surfaces WLR1' may be spaced apart from the bit lines BL. The distance between the first flat surfaces WLP1 and the bit lines BL may be shorter than the distance between the first recess surfaces WLR1' and the bit lines BL.

Like the first sidewall SW1, the second sidewall SW2 may include second flat surfaces WLP2 and second recess surfaces WLR2'. The second flat surfaces WLP2 and the second recess surfaces WLR2' may be alternately repeated in the third direction D3.

The first flat surfaces WLP1 and the second flat surfaces WLP2 may face each other. The first recess surfaces WLR1' and the second recess surfaces WLR2' may face each other. The distance between the first flat surfaces WLP1 and the second flat surfaces WLP2 may be longer than the distance between the first recess surfaces WLR1' and the second recess surfaces WLR2'. The first recess surfaces WLR1' and the second recess surfaces WLR2' may have a round or curved shape. For example, the first recess surfaces WLR1' and the second recess surfaces WLR2' may have a hemispherical notch shape, individually, and they may be symmetrical to each other.

Referring to FIG. 4B, the word line WL may include a first sidewall SW1 which extends in the third direction D3 and a second sidewall SW2 which faces the first sidewall SW2. The first sidewall SW1 may include first flat surfaces WLP1 and first recess surfaces WLR1". Like the first sidewall SW1, the second sidewall SW2 may include the second flat surfaces WLP2 and second recess surfaces WLR2".

The first flat surfaces WLP1 and the second flat surfaces WLP2 may face each other. The first recess surfaces WLR1" and the second recess surfaces WLR2" may face each other. The distance between the first flat surfaces WLP1 and the second flat surfaces WLP2 may be longer than the distance between the first recess surfaces WLR1" and the second recess surfaces WLR2". The first recess surfaces WLR1" and the second recess surfaces WLR2" may have an angled shape. For example, the first recess surfaces WLR1" and the second recess surfaces WLR2" may have a triangular notch shape, individually, and they may be symmetrical to each other.

Figure 5A:
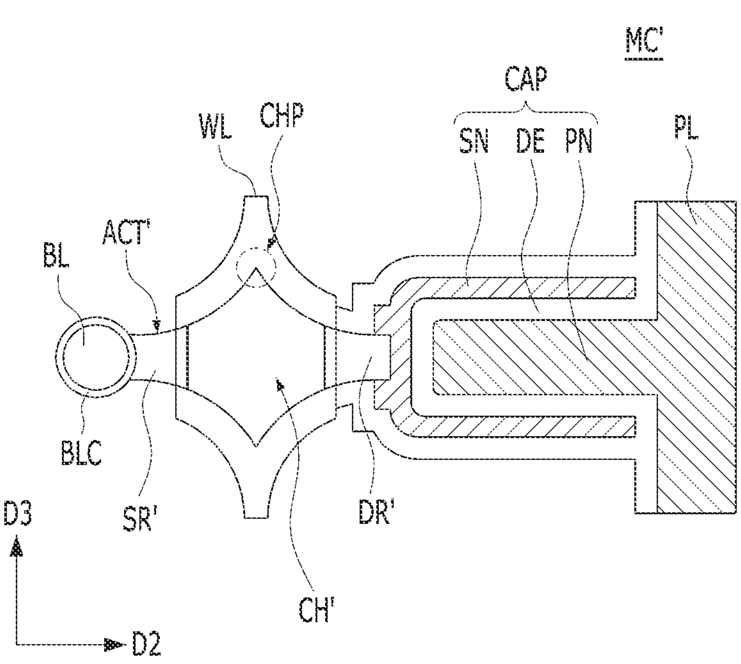
FIG. 5A is a detailed layout illustrating an individual memory cell in accordance with another embodiment of the present invention.

FIG. 5A is a detailed layout illustrating an individual memory cell MC' in accordance with another embodiment of the present invention.

Referring to FIG. 5A, a memory cell MC' may include a bit line BL, a transistor TR, a capacitor CAP, and a plate line PL.

The transistor TR may include an active layer ACT' which includes a channel CH', and first and second source/drain regions SR' and DR' on both sides of the channel CH'. The transistor TR may further include a word line WL vertically overlapping with the active layer ACT'. The active layer ACT' may laterally extend in the second direction D2. The bit line BL and a bit line contact node BLC may be coupled to one side of the active layer ACT', that is, the first source/drain region SR'. The capacitor CAP may be coupled to the other side of the active layer ACT', that is, the second source/drain region DR'.

Figure 5B:
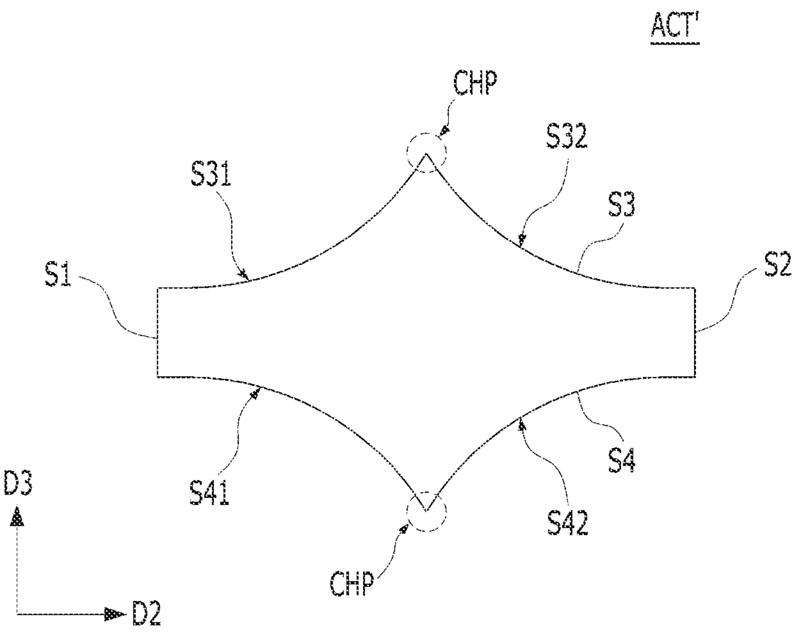
FIG. 5B is a detailed plan view of an active layer shown in FIG. 5A.

The channel CH' may include channel protrusions CHP that are symmetrical to each other in the third direction D3. The distance between the channel protrusions CHP may be greater than the length of the first and second source/drain regions SR' and DR' in the third direction D3. The word line WL may extend in the third direction D3 and may vertically overlap the channel CH' of the active layer ACT'. FIG. 5B is a detailed plan view of the active layer ACT' shown in FIG. 5A.

Referring to FIG. 5B, the active layer ACT' may include first to fourth sidewalls S1 to S4. The first sidewall S1 and the second sidewall S2 may face each other in the second direction D2, and the third sidewall S3 and the fourth sidewall S4 may face each other in the third direction D3. The first and second sidewalls S1 and S2 may be flat sidewalls, and the third and fourth sidewalls S3 and S4 may be round or curved sidewalls.

The third sidewall S3 may include a channel protrusion CHP and round sub-sidewalls S31 and S32, and the round sub-sidewalls S31 and S32 are symmetrical to each other with the channel protrusion CHP therebetween.

The fourth sidewall S4 may include a channel protrusion CHP and round sub-sidewalls 541 and S42, and the round sub-sidewalls S31 and S32 are symmetrical to each other with the channel protrusion CHP therebetween.

Figure 5C:
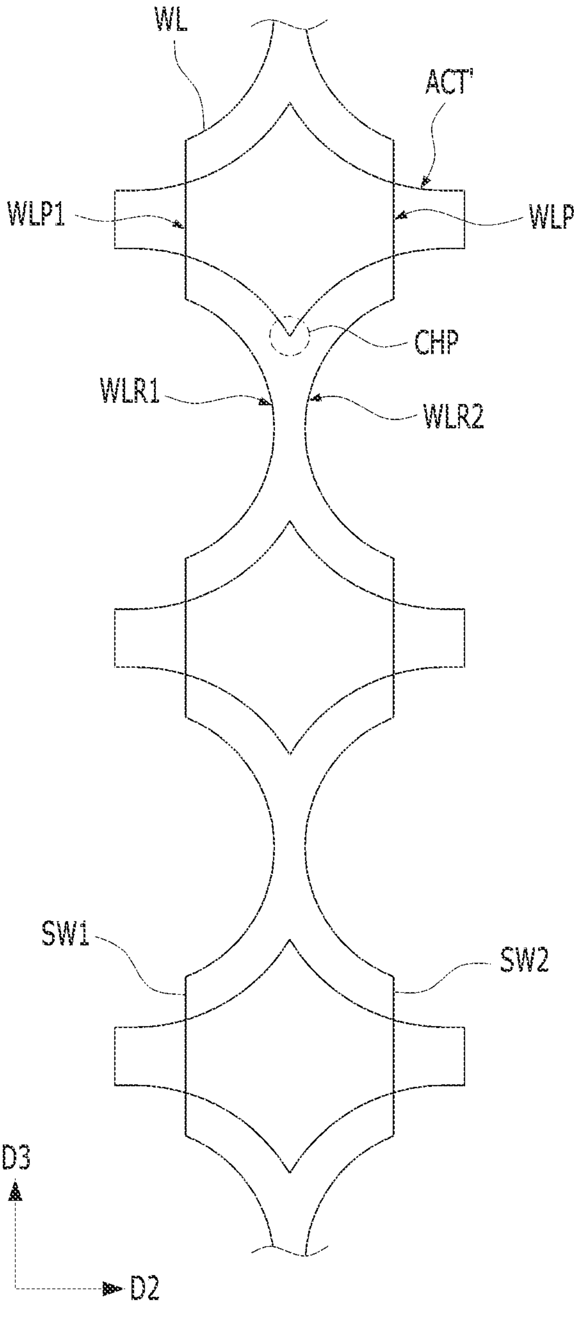
FIG. 5C is a detailed layout of a word line and an active layer shown in FIG. 5A.

The channel protrusions CHP of the third and fourth sidewalls S3, S4 may face each other or aligned in the third direction D3. FIG. 5C is a detailed layout of the word line and the active layer shown in FIG. 5A. It shows a portion of an array of memory cells MC' of FIG. 5A.

Referring to FIG. 5C, the word line WL may include a notch-shaped first sidewall SW1 extending in the third direction D3, and a notch-shaped second sidewall SW2 facing the first sidewall SW2. The first sidewall SW1 may include first flat surfaces WLP1 and first recess surfaces WLR1. The first flat surfaces WLP1 and the first recess surfaces WLR1 may be alternately repeated in the third direction D3. The first flat surfaces WLP1 may be flat sidewalls, and the first recess surfaces WLR1 may be recessed curved sidewalls.

Like the first sidewall SW1, the second sidewall SW2 may include second flat surfaces WLP2 and second recess surfaces WLR2. The second flat surfaces WLP2 and the second recess surfaces WLR2 may be alternately repeated in the third direction D3.

The first flat surfaces WLP1 and the second flat surfaces WLP2 may face each other. The first recess surfaces WLR1 and the second recess surfaces WLR2 may face each other. The distance between the first flat surfaces WLP1 and the second flat surfaces WLP2 may be longer than the distance between the first recess surfaces WLR1 and the second recess surfaces WLR2. The first recess surfaces WLR1 and the second recess surfaces WLR2 may have a round or curved shape. For example, the first recess surfaces WLR1 and the second recess surfaces WLR2 may have a hemi-spherical notch shape, individually, and they may be symmetrical to each other.

The word line WL and the channel protrusions CHP of the channels CH' may overlap with each other.

In the above-described embodiments, individual memory cells MC may be formed using an ONPN stack. For example, silicon oxide, first silicon nitride, polysilicon, and second silicon nitride may be sequentially stacked, and then the first silicon nitride and the second silicon nitride may be replaced with the word lines.

Figure 6A:
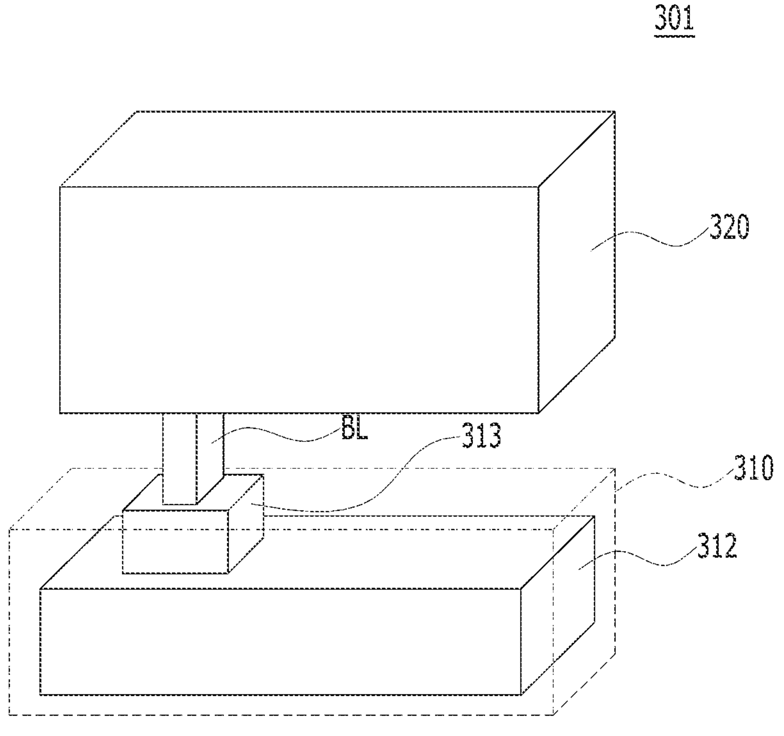
FIGS. 6A and 6B are perspective views illustrating a memory device in accordance with another embodiment of the present invention.
Figure 6B:
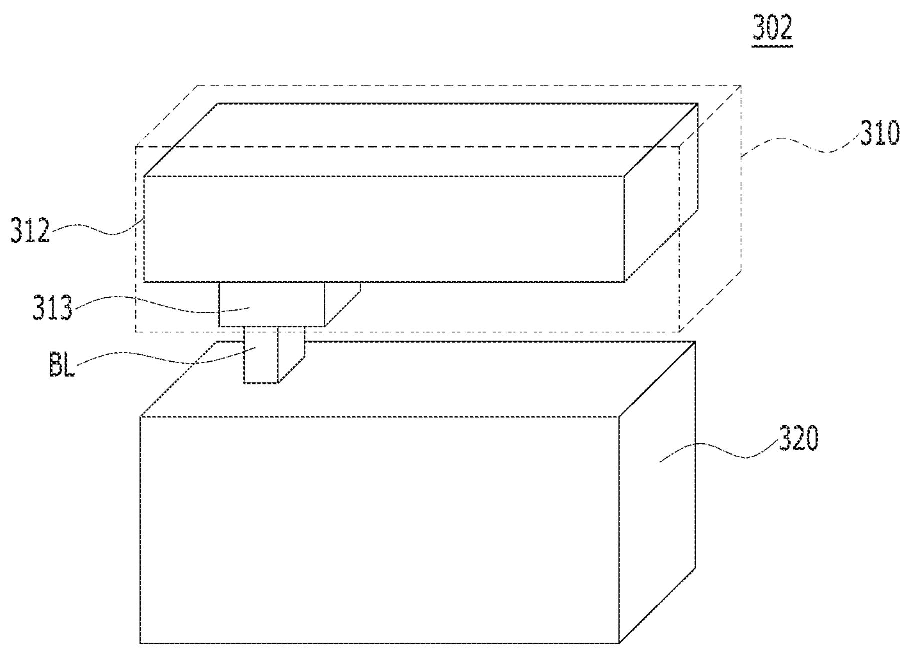

FIGS. 6A and 6B are perspective views illustrating a memory device in accordance with another embodiment of the present invention.

Referring to FIGS. 6A and 6B, each of the memory devices 301 and 302 may include a peripheral circuit portion 310 and a memory cell array 320. The memory cell array 320 may include the memory cell array MCA shown in FIG. 1. The memory cell array 320 may include a DRAM memory cell array. The memory cell array 320 may include memory cells MC and MC', described above.

Referring to FIG. 6A, the memory cell array 320 may be positioned over the peripheral circuit portion 310. Accordingly, the memory device 301 may have a PUC (Peri-under-Cell) structure.

Referring to FIG. 6B, the memory cell array 320 may be positioned below the peripheral circuit portion 310. Accordingly, the memory device 302 may have a CUP (Cell-under-Peri) structure.

The peripheral circuit portion 310 may include, for example, a semiconductor substrate 312 and a sense amplifier 313 which is arranged over the semiconductor substrate 312. The sense amplifier 313 may include transistors having the semiconductor substrate 312 as a channel, and the transistors may be planar channel transistors whose channels are parallel to the surface of the semiconductor substrate 312. Except for the planar channel transistor, the transistor structure in the sense amplifier 313 may include a recess channel transistor, a buried gate transistor, and a fin channel transistor (FinFET).

The bit lines BL of the memory cell array 320 may be electrically connected to transistors of the sense amplifier 313. Although not illustrated, the bit lines BL and the transistors of the sense amplifier 313 may be coupled to each other through a multi-level metal wire MLM. The multi-level metal wire MLM may be formed by a Damascene process.

Although not shown, according to another embodiment of the present invention, each of the memory devices 301 and 302 may include a first semiconductor substrate and a second semiconductor substrate bonded to the first semiconductor substrate. The memory cell array 320 may be formed over the first semiconductor substrate, and the peripheral circuit portion 310 may be formed over the second semiconductor substrate. Each of the first semiconductor substrate and the second semiconductor substrate may include conductive bonding pads, and the first semiconductor substrate and the second semiconductor substrate may be bonded through the conductive bonding pads. Accordingly, the memory cell array 320 and the peripheral circuit portion 310 may be electrically connected.

According to the embodiment of the present invention, a memory device may include transistors and capacitors that are stacked over a substrate in three dimensions. Accordingly, the degree of integration of the memory device may be improved.

According to the embodiment of the present invention, a shield word line may block the interference between the memory cells that are vertically positioned in a memory device.

While the present invention has been described with respect to specific embodiments, it will be apparent to those skilled in the art that various changes and modifications may be made without departing from the spirit and scope of the invention as defined in the following claims.

What is claimed is:

1. A memory cell, comprising:

a substrate;

an active layer spaced apart from a surface of the substrate and including a channel extending in a direction which is parallel to the surface of the substrate;

a bit line coupled to one side of the active layer and extending in a direction perpendicular to the surface of the substrate;

a capacitor coupled to another side of the active layer and spaced apart from the surface of the substrate; and a word line vertically spaced apart from the active layer and extending in a direction crossing the active layer, wherein the channel of the active layer includes round sidewalls having protrusions vertically overlapping with the word line.

2. The memory cell of claim 1, wherein the channel includes:

a first round sidewall having a first protrusion; and a second round sidewall having a second protrusion, wherein the first round sidewall and the second round sidewall face each other in a direction that the word line extends.

3. The memory cell of claim 2, wherein the first round sidewall includes first round sub-sidewalls that are symmetrical to each other with the first protrusion therebetween, and the second round sidewall includes second round sub-sidewalls that are symmetrical to each other with the second protrusion therebetween.

4. The memory cell of claim 1, wherein the word line includes a first notch-shaped sidewall and a second notch-shaped sidewall facing each other.

5. The memory cell of claim 4, wherein each of the first notch-shaped sidewall and the second notch-shaped sidewall includes a plurality of flat surfaces and a plurality of recessed surfaces.

6. The memory cell of claim 5, wherein the flat surfaces and the recessed surfaces alternate in the direction that the word line extends.

7. The memory cell of claim 6, wherein the flat surfaces are adjacent to the bit line.

8. The memory cell of claim 6, wherein the recessed surfaces include a hemispherical notch shape, a triangular notch shape, or a rectangular notch shape.

9. The memory cell of claim 4, further comprising:

a dielectric supporter supporting each of the first notch-shaped sidewall and the second notch-shaped sidewall of the word line.

10. The memory cell of claim 1, wherein the word line has a double word line structure in which two word lines vertically face each other with the active layer interposed therebetween.

11. The memory cell of claim 1, wherein the word line includes a notch-shaped word line and a notch-shaped shield word line that vertically face each other with the active layer interposed therebetween.

12. The memory cell of claim 1, wherein the word line includes a first notch-shaped sidewall and a second notch-shaped sidewall that face each other, wherein each of the first notch-shaped sidewall and the second notch-shaped sidewall includes a plurality of flat surfaces and a plurality of recessed surfaces, and wherein a distance between the flat surfaces and the bit line is shorter than a distance between the recessed surfaces and the bit line.

* * * * *